(12) United States Patent
Vidal et al.

(10) Patent No.: US 12,092,527 B2
(45) Date of Patent: Sep. 17, 2024

(54) TEMPERATURE SENSOR DEVICE FOR A WINDSHIELD OF A VEHICLE

(71) Applicant: MEAS France, Toulouse (FR)

(72) Inventors: Yannick Vidal, Toulouse (FR); Vincent Leger, Toulouse (FR)

(73) Assignee: MEAS France, Toulouse (FR)

( * ) Notice: Subject to any disclaimer, the term of this patent is extended or adjusted under 35 U.S.C. 154(b) by 900 days.

(21) Appl. No.: 17/014,087

(22) Filed: Sep. 8, 2020

(65) Prior Publication Data
US 2021/0102845 A1   Apr. 8, 2021

(30) Foreign Application Priority Data

Oct. 4, 2019   (EP) ..................................... 19306282

(51) Int. Cl.
| | | |
|---|---|---|
| *G01K 1/143* | (2021.01) | |
| *B60S 1/02* | (2006.01) | |
| *B60S 1/08* | (2006.01) | |
| *G01K 1/14* | (2021.01) | |
| *G01K 1/16* | (2006.01) | |
| *G01K 7/22* | (2006.01) | |
| *H05K 1/18* | (2006.01) | |

(52) U.S. Cl.
CPC .............. *G01K 1/143* (2013.01); *B60S 1/026* (2013.01); *B60S 1/0818* (2013.01); *B60S 1/0822* (2013.01); *B60S 1/0866* (2013.01); *B60S 1/0881* (2013.01); *G01K 1/14* (2013.01); *G01K 1/16* (2013.01); *G01K 7/22* (2013.01); *H05K 1/181* (2013.01)

(58) Field of Classification Search
CPC  G01K 1/143; G01K 1/14; G01K 1/16; G01K 7/22; B60S 1/026; B60S 1/0818; B60S 1/0822; B60S 1/0866; B60S 1/0881; H05K 1/181
See application file for complete search history.

(56) References Cited

U.S. PATENT DOCUMENTS

| | | | | |
|---|---|---|---|---|
| 4,936,533 | A * | 6/1990 | Adams | B60R 1/04 248/222.13 |
| 7,405,669 | B2 * | 7/2008 | Pflugl | B60H 1/00785 73/335.06 |
| 9,896,039 | B2 * | 2/2018 | Achenbach | B60R 1/00 |
| 9,910,000 | B2 * | 3/2018 | Lynam | G01N 25/66 |
| 11,320,588 | B1 * | 5/2022 | Mazed | G16H 10/40 |

(Continued)

FOREIGN PATENT DOCUMENTS

| | | |
|---|---|---|
| FR | 2943416 A1 | 9/2010 |
| JP | 6191507 B2 | 9/2017 |

OTHER PUBLICATIONS

Extended European Search Report, European Application No., 19306282.5-1001, European Filing Date, Mar. 11, 2020.

*Primary Examiner* — Nathaniel T Woodward
*Assistant Examiner* — Philip L Cotey
(74) *Attorney, Agent, or Firm* — Barley Snyder

(57) ABSTRACT

A temperature sensor device for sensing a temperature of a windshield of a vehicle includes a single printed circuit board having a circuitry, a temperature sensor mounted on the printed circuit board, and a thermally conductive pad attached to the temperature sensor. The thermally conductive pad is arranged to thermally and mechanically directly contact the windshield.

20 Claims, 2 Drawing Sheets

(56) References Cited

U.S. PATENT DOCUMENTS

| | | | | |
|---|---|---|---|---|
| 2004/0020285 | A1* | 2/2004 | Schneider | B60S 1/0888 |
| | | | | 340/602 |
| 2006/0087820 | A1* | 4/2006 | Yang | H05K 1/0201 |
| | | | | 361/783 |
| 2006/0176184 | A1* | 8/2006 | Pflugl | B60H 1/00785 |
| | | | | 340/602 |
| 2007/0222997 | A1* | 9/2007 | Gotoh | B60S 1/0822 |
| | | | | 356/445 |
| 2008/0258743 | A1* | 10/2008 | Schmitt | B60H 1/00785 |
| | | | | 324/694 |
| 2008/0317093 | A1* | 12/2008 | Mau | G01J 5/049 |
| | | | | 374/E13.003 |
| 2009/0316751 | A1* | 12/2009 | Mau | G01K 1/143 |
| | | | | 374/165 |
| 2012/0013741 | A1* | 1/2012 | Blake, III | H04N 23/55 |
| | | | | 348/148 |
| 2013/0076905 | A1* | 3/2013 | Blake, III | G03B 17/02 |
| | | | | 348/148 |
| 2014/0341250 | A1* | 11/2014 | Lynam | B60H 1/00785 |
| | | | | 374/28 |
| 2015/0327398 | A1* | 11/2015 | Achenbach | H04N 7/181 |
| | | | | 348/148 |
| 2016/0100084 | A1* | 4/2016 | Schofield | B60Q 1/22 |
| | | | | 348/148 |
| 2018/0156670 | A1* | 6/2018 | Otsuka | G01K 1/16 |
| 2019/0226918 | A1* | 7/2019 | Hand | G01K 13/02 |
| 2019/0356508 | A1* | 11/2019 | Trikha | G02F 1/1533 |
| 2020/0088590 | A1* | 3/2020 | Niemann | G01K 13/10 |
| 2022/0373405 | A1* | 11/2022 | Lee | G01K 7/22 |

* cited by examiner

TEMPERATURE SENSOR DEVICE FOR A WINDSHIELD OF A VEHICLE

CROSS-REFERENCE TO RELATED APPLICATION

This application claims the benefit of the filing date under 35 U.S.C. § 119(a)-(d) of European Patent Application No. 19306282, filed on Oct. 4, 2019.

FIELD OF THE INVENTION

The present invention relates to a temperature sensor device and, more particularly, to a temperature sensor device for sensing the temperature of a windshield of a vehicle.

BACKGROUND

Temperature sensors, humidity sensors, optical sensors or a combination thereof are known to be used in windshield sensing devices installed in vehicles for the purpose of automatically controlling the heating, ventilation, air conditioning and operation of the windshield wiper. As an example, a windshield temperature sensing device is commonly used for preventing fogging conditions.

For allowing a precise and reliable monitoring of the temperature and/or the humidity at a windshield of a vehicle, the sensor of the sensing device has to be reliably kept in constant contact with the surface of the windshield during the whole lifetime of the vehicle, and thus the sensor and connection of the same to the windshield has to withstand mechanical shocks and vibrations over the entire lifetime. Therefore, the sensor needs to be securely attached to the windshield.

In the art, sensor devices comprising printed circuit boards (PCBs) are known. For example, a thermistor is attached to a flexible polyimide film. One end of the polyimide film is connected to a PCB and another end, on which the thermistor is attached, is attached to the windshield surface. The end provided with the thermistor can be pressed against the windshield surface by means of foam elements made of thermal foam, arranged on either side of the thermistor. However, the foam used for fixing the polyimide film with the thermistor on the windshield is subject to ageing, degradation and/or mechanical stress. Furthermore, the soldering of the thermistor on the polyimide film, the soldering of the sensing device to the PCB and the soldering of the connector pin contact to the PCB represents a rather complex and costly manufacturing procedure.

According to another approach, the windshield temperature is measured by a thermistor attached to one PCB in contact with the windshield and connected to another PCB providing the processing of the measurement data via two spring elements that are also used to try to keep permanent contact of the PCB that is provided with the thermistor with the windshield surface. Again, the overall manufacturing procedure is rather time-consuming and expensive and the resulting structure is rather complex and prone to detachment from the windshield.

According to an alternative approach a thermistor is placed on a flexible PCB. Again, the overall manufacturing procedure is rather time-consuming and expensive.

SUMMARY

A temperature sensor device for sensing a temperature of a windshield of a vehicle includes a single printed circuit board having a circuitry, a temperature sensor mounted on the printed circuit board, and a thermally conductive pad attached to the temperature sensor. The thermally conductive pad is arranged to thermally and mechanically directly contact the windshield.

BRIEF DESCRIPTION OF THE DRAWINGS

The invention will now be described by way of example with reference to the accompanying Figures, of which.

DETAILED DESCRIPTION OF THE EMBODIMENT(S)

Features and advantages of the present invention will be described in detail below with reference to the drawings. In the description, reference is made to the accompanying figures that are meant to illustrate embodiments of the invention. It is understood that such embodiments do not represent the full scope of the invention. All embodiments described herein are not intended as limitations but serve as examples illustrating features and advantages of the invention. It is to be understood that some or all of the described features can also be combined in different ways.

Figure 1:
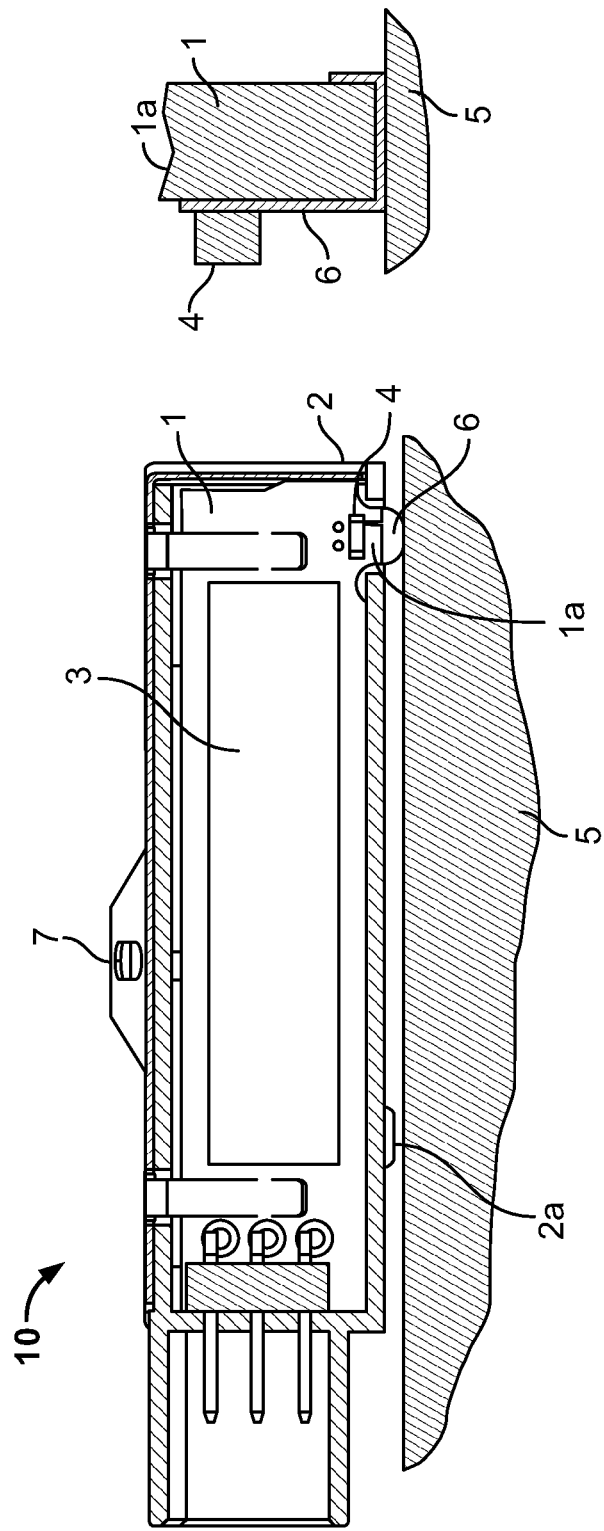
FIG. 1 is a sectional side view of a temperature sensor device according to an embodiment and a part of the temperature sensor device.

A temperature sensor device 10 according to an embodiment is shown in FIG. 1. The temperature sensor device 10 includes a printed circuit board (PCB) 1 encased in a housing 2. Some circuitry 3 is formed on the PCB 1. The circuitry 3 comprises circuitry elements used for data processing and sensor control.

The PCB 1, as shown in FIG. 1, has a tab portion 1a. In the shown embodiment, the PCB 1 is a single, non-flexible, i.e. rigid, PCB that cannot be bent or rolled up significantly without breakage. The bend radius of the PCB 1 used herein may, in particular, be below 1 mm.

A temperature sensor 4 is attached to the tab portion 1a as shown in FIG. 1. Thereby, the temperature sensor 4 is directly mounted to the PCB 1. For example, the temperature sensor 4 is soldered to the tab portion 1a. In fact, the temperature sensor 4 can be soldered to the tab portion 1a of the PCB 1 within the process of soldering all or some of the other electronic components of the circuitry 3 (during some reflow processing, for example) to the PCB 1. The circuitry 3 may comprise a measurement and control circuitry for processing data sensed by the temperature sensor 4 and for controlling the temperature sensor 4.

According to an embodiment, the temperature sensor 4 is a thermistor. The thermistor can be a Negative Temperature Coefficient (NTC) thermistor that is characterized by a resistance decreasing exponentially with the sensed temperature. The NTC thermistor may be made based on polycrystalline oxide ceramics, in particular, exhibiting a crystal structure that is basically a spinel structure resulting from a sintering process.

In another embodiment another sensor, for example, a humidity sensor may be additionally mounted on the PCB 1.

In order to sense the temperature of a windshield 5 of a vehicle, a reliable thermal contact to the windshield 5 has to be provided. As shown in FIG. 1, the thermal contact is provided by a thermally conductive pad 6 connected to the temperature sensor 4. The thermally conductive pad 6 may be made of or comprise a noble metal, for example, gold or copper or some alloy thereof.

The thermally conductive pad 6 is attached to the temperature sensor 4 and arranged to thermally and mechanically directly contact an inner surface of the windshield 5. In an embodiment, the thermally conductive pad 6 may be attached to an edge of the tab portion 1*a* of the PCB 1. The temperature sensor 4 does not need to directly contact the windshield 5 but rather the contact is made via the thermally conductive pad 6. Thereby, a degradation of the temperature sensor 4 during the lifetime can be reduced. The housing 2 has an extension 2*a* corresponding to the thermally conductive pad 6 that may also contact the windshield 5.

In order to attach the temperature sensor device 10 to the windshield 5, an attachment device 7 is provided as shown in FIG. 1. The attachment device 7 of the temperature sensor device 10 can be a clip member, for example, a metallic clip member, that is configured to be clipped to a bracket member that may be positioned at the windshield 5 or a rearview mirror installed in a vehicle, for example. When the clip member 7 is fastened to the bracket member, a reliable and permanent mechanical and thermal contact between the windshield 5 and the temperature sensor device 10 (and—via the thermally conductive pad 6—the temperature sensor 4 of the temperature sensor device 10) is achieved.

The PCB 1 includes electrically and thermally conductive lines, in particular, copper lines, that may be arranged to receive some heat flow from the windshield 5, and the temperature sensor 4 may be arranged in thermal contact with at least some of the conductive lines. When the temperature sensor device 10 is attached to the windshield 5, the conductive lines may provide a thermal conduction of heat radiated by windshield 5 the towards the temperature sensor 4 whereby the accuracy of the temperature measurement can be significantly increased.

The temperature sensor device 10 can be relatively easily and cost-efficiently produced using one single PCB 1 only on which the temperature sensor 4 is mounted. Particularly, by attaching the thermally conductive pad 6 to the temperature sensor 4 and arranging the thermally conductive pad 6 in direct contact the inner surface of the windshield 5, an easily to realize thermal contact allowing for a long-term reliable temperature measurement procedure is achieved. By the temperature sensor device 10, a low cost defogging control and/or wiper control in an automobile compartment can be realized, for example.

Figure 2:
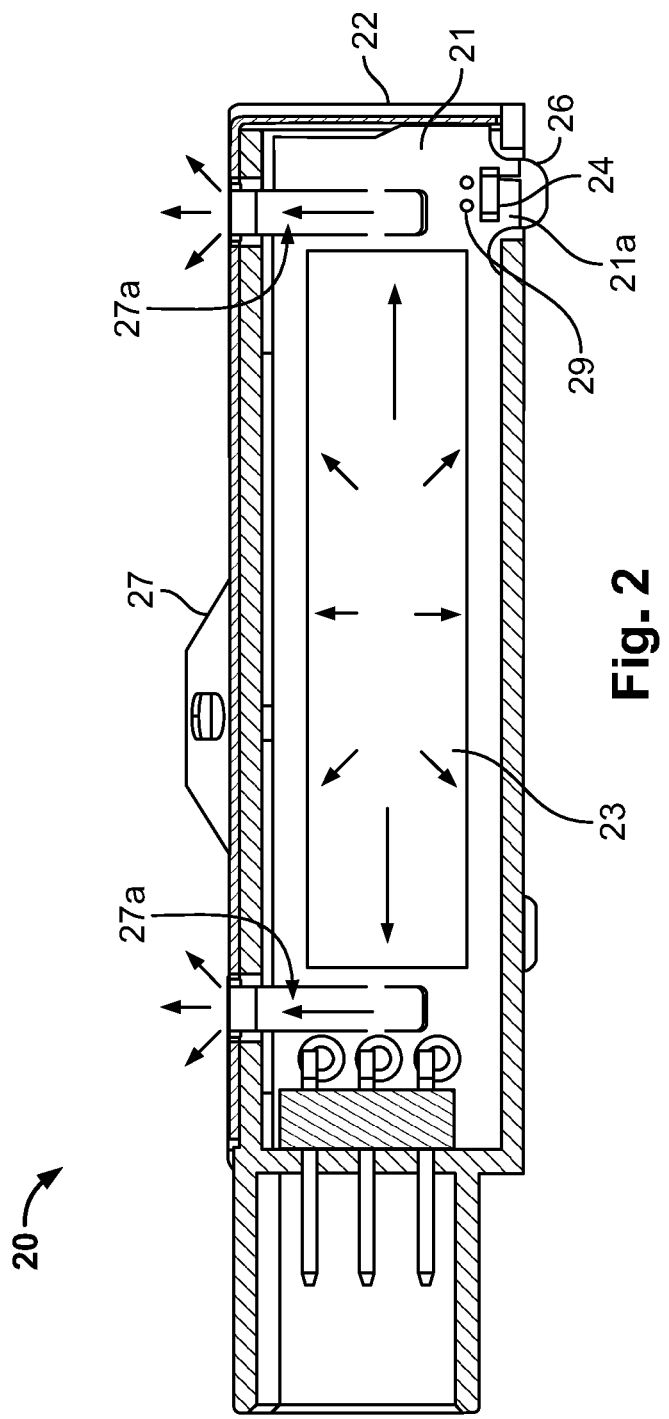
FIG. 2 is a sectional side view of a temperature sensor device according to another embodiment.

Another embodiment of an inventive temperature sensor device 20 is illustrated in FIG. 2. The temperature sensor device 20 is very similar to the one shown in FIG. 1. The temperature sensor device 20 comprises a single rigid PCB 21 that is encased in a housing 22. Some circuitry 23 is formed on the PCB 21. The circuitry 23 comprises circuitry elements used for data processing and sensor control.

A temperature sensor 24, for example, a (NTC) thermistor, is attached to a tab portion 21*a* of the PCB 21 as shown in FIG. 2. Thereby, the temperature sensor 24 is directly mounted to the PCB 1. For example, the temperature sensor 24 is soldered to the tab portion 21*a* of the PCB 21. The temperature sensor 24 is connected to a thermally conductive pad 26 that may be made of or comprise a noble metal, for example, gold. The thermally conductive pad 26 provides a thermal contact with the windshield, the temperature of which has to be sensed by the temperature sensor 24.

A clip member 27 serves for attachment of the temperature sensor device 20 to a windshield of a vehicle. The clip member 27 has clip tabs 27*a* that are fastened to the housing 22 and may also be fastened to the PCB 21. Particularly, the clip tabs 27*a* are in thermal contact with the circuitry 23 that is formed on the PCB 21.

Heat flow of heat generated by the electronic components of the PCB 21 is indicated by the arrows in FIG. 2. It is desirable that heat generated by the electronic components of the circuitry 23 of the PCB 21 does not influence the measurement of the temperature of the windshield by the temperature sensor 24. Therefore, the clip tabs 27*a* of the clip member 27 are made of a material, for example, a metal material, that allows for conducting the heat generated by the circuitry 23 away from the temperature sensor 24.

Additionally, some heat barrier may be provided for blocking heat flow towards the temperature sensor 24. In the embodiment shown in FIG. 2, such a barrier comprises openings 29 formed in the PCB 21 that allow for the dissipation of heat generated by the electronic components of the circuitry 23 of the PCB 21. The openings 29 are arranged between at least portions of the circuitry 23 and the temperature sensor 24. Such openings 29 also increase the accuracy of the temperature measurement since the influence of heat generated by the electronic components of the circuitry 23 on the temperature sensing carried out by the temperature sensor 24 can significantly be reduced.

In an embodiment, a defogging control device or a wiper operation control device for a motor vehicle includes a humidity sensor device for sensing the humidity of the windshield 5, and the temperature sensor device 10, 20 according to one of the above-described embodiments.

A method of attaching the temperature sensor device 10, 20 to the windshield 5 of a vehicle comprises the steps of:

providing a bracket member at the windshield 5 or a rearview mirror installed in the vehicle;

providing the temperature sensor device 10, 20 including the PCB 10 having thermally and electrically conductive lines; and fastening the temperature sensor device 10, 20 to the bracket member such that the thermally conductive pad 6 thermally and mechanically directly contacts the windshield 5 at an inner surface of the windshield 5 directed towards a compartment of the vehicle.

What is claimed is:

1. A temperature sensor device for sensing a temperature of a windshield of a vehicle, comprising:
   a housing;
   a single printed circuit board arranged in the housing and having a circuitry;
   an attachment device including a plurality of clip tabs adapted to attach the temperature sensor device to the windshield, wherein at least one of the plurality of clip tabs directly contacts the housing and at least one of the plurality of clip tabs directly contacts the printed circuit board through the housing;
   a temperature sensor mounted on the printed circuit board; and
   a thermally conductive pad directly connected to the temperature sensor and arranged to thermally and mechanically directly contact the windshield.

2. The temperature sensor device of claim 1, wherein the circuitry is a measurement and control circuitry.

3. The temperature sensor device of claim 1, wherein the temperature sensor is a thermistor.

4. The temperature sensor device of claim 1, wherein the printed circuit board has a tab portion, the temperature sensor is mounted to the tab portion.

5. The temperature sensor device of claim 4, wherein the thermally conductive pad is attached to the tab portion.

6. The temperature sensor device of claim 5, wherein the thermally conductive pad is attached to an edge of the tab portion.

7. The temperature sensor device of claim 6, wherein:
the tab portion extends through a first opening in the housing in a first direction; and
the thermally conductive pad extends from the edge of the tab portion and through the first opening in the housing to the temperature sensor.

8. The temperature sensor device of claim 7, wherein the housing defines an extension protruding from a remainder of the housing in the first direction and adapted to contact the windshield.

9. The temperature sensor device of claim 7, wherein the at least one of the plurality of clip tabs directly contacting the printed circuit board contacts the printed circuit board through a second opening formed through the housing.

10. The temperature sensor device of claim 1, wherein the printed circuit board has a plurality of electrically and thermally conductive lines arranged to receive a heat flow from the windshield.

11. The temperature sensor device of claim 10, wherein the electrically and thermally conductive lines are copper lines.

12. The temperature sensor device of claim 10, wherein the temperature sensor is in thermal contact with at least some of the electrically and thermally conductive lines.

13. The temperature sensor device of claim 1, wherein the printed circuit board has a plurality of openings arranged between portions of the circuitry and the temperature sensor.

14. The temperature sensor device of claim 1, wherein the temperature sensor is soldered to the printed circuit board.

15. The temperature sensor device of claim 1, wherein the printed circuit board is a non-flexible printed circuit board.

16. The temperature sensor device of claim 1, wherein the at least one of the plurality of clip tabs directly contacting the printed circuit board is adapted to conduct heat emitted by the circuitry away from the temperature sensor.

17. The temperature sensor device of claim 16, wherein the plurality of clip tabs are formed from a metal material.

18. A temperature sensor device for sensing a temperature of a windshield of a vehicle, comprising:
a housing;
a single printed circuit board arranged within the housing and having a circuitry, a tab portion of the printed circuit board extending through an opening in the housing in a first direction;
a temperature sensor mounted on the tab portion of the printed circuit board;
a thermally conductive pad arranged over and fixed with respect to an end edge of the tab portion and directly connected to the temperature sensor through the opening in the housing, the thermally conductive pad having a contact end including a first side directly contacting the end edge of the tab portion and a second side directly opposite the first side in the first direction and adapted to directly contact the windshield thermally and mechanically.

19. The temperature sensor device of claim 18, wherein the thermally conductive pad first includes a first segment arranged on a first side of the printed circuit board and connected to the temperature sensor, and a second segment arranged on a second side of the printed circuit board opposite the first side, the contact end of the thermally conductive pad is arranged between and connects the first segment and the second segment.

20. The temperature sensor device of claim 19, wherein:
the first segment of the thermally conductive pad extends in the first direction from the temperature sensor to a first end of the contact end;
the second segment of the thermally conductive pad extends from a second end of the contact end opposite the first end in a second direction opposite the first direction;
the contact end of the thermally conductive pad extends transverse to the first direction and the second direction;
the printed circuit board is arranged directly between the first and second segments of the thermally conductive pad.

* * * * *